US007679285B2

(12) United States Patent
Kim et al.

(10) Patent No.: US 7,679,285 B2
(45) Date of Patent: Mar. 16, 2010

(54) PLASMA DISPLAY DEVICE

(75) Inventors: Sok-San Kim, Suwon-si (KR);
Tae-Kyoung Kang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 1042 days.

(21) Appl. No.: 11/242,053

(22) Filed: Oct. 4, 2005

(65) Prior Publication Data

US 2006/0087233 A1    Apr. 27, 2006

(30) Foreign Application Priority Data

Oct. 25, 2004    (KR)    ............... 10-2004-0085245

(51) Int. Cl.
*H01J 17/49*    (2006.01)
(52) U.S. Cl. .................................. 313/582; 313/45
(58) Field of Classification Search ............ 313/45–46, 313/582–587; 156/250
See application file for complete search history.

(56) References Cited

U.S. PATENT DOCUMENTS

| | | | | |
|---|---|---|---|---|
| 5,831,374 A * | 11/1998 | Morita et al. | .............. | 313/46 |
| 6,346,334 B1 * | 2/2002 | Kamitani | .............. | 428/521 |
| 6,617,767 B2 * | 9/2003 | Juen | .............. | 313/44 |
| 6,700,315 B2 * | 3/2004 | Kim et al. | .............. | 313/46 |
| 6,849,992 B2 * | 2/2005 | Kim et al. | .............. | 313/46 |
| 6,852,573 B2 * | 2/2005 | Ebihara et al. | .............. | 438/122 |
| 7,161,296 B2 * | 1/2007 | Kim et al. | .............. | 313/581 |
| 7,235,922 B2 * | 6/2007 | Jun et al. | .............. | 313/582 |
| 7,323,808 B2 * | 1/2008 | Kim et al. | .............. | 313/44 |
| 2003/0017320 A1 * | 1/2003 | Ebihara et al. | .......... | 428/306.6 |
| 2003/0025428 A1 | 2/2003 | Kim | | |
| 2003/0230381 A1 * | 12/2003 | Watanabe | .............. | 156/250 |
| 2005/0212429 A1 * | 9/2005 | Aoki et al. | .............. | 313/587 |
| 2006/0290251 A1 * | 12/2006 | Shives et al. | .............. | 313/46 |

FOREIGN PATENT DOCUMENTS

| | | |
|---|---|---|
| JP | 09017343 | 1/1997 |
| JP | 2001033605 | 2/2001 |
| JP | 2002202729 | 7/2002 |
| JP | 2004146106 | 5/2004 |

* cited by examiner

*Primary Examiner*—Toan Ton
*Assistant Examiner*—Hana A Sanei
(74) *Attorney, Agent, or Firm*—H.C. Park & Associates, PLC

(57) ABSTRACT

The plasma display device has an improved structural assembly that includes improved heat transfer interfaces between each of a chassis base and a PDP and a thermally conductive member interposed therebetween. The plasma display device may include a plasma display panel; a chassis base supporting the plasma display panel; a thermally conductive member disposed between the plasma display panel and the chassis base; a first adhesive layer formed between the plasma display panel and the thermally conductive member to adhere the plasma display panel and the thermally conductive member; and a second adhesive layer formed between the thermally conductive member and the chassis base to adhere the thermally conductive member and the chassis base. An adhesive strength of the first adhesive layer may be greater than an adhesive strength of the second adhesive layer.

8 Claims, 3 Drawing Sheets

PLASMA DISPLAY DEVICE

CROSS-REFERENCE TO RELATED APPLICATIONS

This application claims priority to and the benefit of Korean Patent Application No. 10-2004-0085245 filed in the Korean Intellectual Property Office on Oct. 25, 2004, the entire content of which is incorporated herein by reference.

BACKGROUND OF THE INVENTION

1. Field of the Invention

The present invention relates to a plasma display device, and more particularly, to a structural assembly of a plasma display panel and a chassis base of the plasma display device.

2. Description of the Related Art

In a plasma display device, images are displayed on a plasma display panel (PDP) using plasma generated by gas discharge. During discharge, heat is unavoidably generated in the PDP. Further, attempting to improve brightness by increasing the discharge generates an even greater amount of heat within the PDP. Consequently, the PDP may be damaged if the heat is not efficiently exhausted from the PDP. In a conventional plasma display device, the PDP is attached to a chassis base made of a highly thermally-conductive material. Interposed between the PDP and the chassis base is a thermally conductive member such as a heat dissipation sheet. In use, the heat generated from the PDP is transmitted through the thermally conductive member and the chassis base and expelled to outside the display device. Additionally, a thermally conductive adhesive may be applied to both sides of the thermally conductive member to adhere the thermally conductive member to the PDP and the chassis base.

Conventional processes of assembling a plasma display device may involve plural firing steps using heat. The heat generated by these firing steps may cause the plasma display panel to distort or warp.

During an assembly process, the chassis base and the PDP are pressed together, which fixedly adheres the thermally conductive member to both the PDP and the chassis base. Thus, as the PDP and the chassis base are pressed together, the PDP is bent toward and adhered to the intervening thermally conductive member by an external pressing force. Since the restoring force is greater than the adhesion force(s) adhering the PDP to the thermally conductive member, if the pressure to the PDP is eliminated, the PDP will revert to substantially its original shape, and some previously adhered portions of the PDP will partially separate from the thermally conductive member. The gap(s) created by the separation(s) reduce the efficiency of heat transfer.

Therefore, the structure and adhesion characteristics of a conventional plasma display device are problematic in that the conventional PDP does not closely and permanently contact the thermally conductive member. Consequently, noise and vibration are generated during discharge, and the overall efficiency of heat transfer is significantly reduced.

SUMMARY OF THE INVENTION

An improved plasma display device is disclosed. The plasma display device may include an improved heat transfer interface among each of a (heat distorted) plasma display panel (PDP), a chassis base, and a thermally conductive member positioned therebetween. The improved interface is configured so that at least the (heat distorted) PDP can uniformly and substantially couple to the thermally conductive member.

In one embodiment, the improved plasma display device may include, a plasma display panel; a chassis base supporting the plasma display panel; a thermally conductive member disposed between the plasma display panel and the chassis base; a first adhesive layer formed between the plasma display panel and the thermally conductive member to adhere plasma display panel and the thermally conductive member; and a second adhesive layer formed between the thermally conductive member and the chassis base to adhere the thermally conductive member and the chassis base. The adhesive strength of the first adhesive layer may be greater than the adhesive strength of the second adhesive layer.

In another embodiment, an improved plasma display device may include a plasma display panel; a chassis base supporting the plasma display panel; a thermally conductive member disposed between the plasma display panel and the chassis base; a first adhesive layer formed between the plasma display panel and the thermally conductive member to adhere the plasma display panel and the thermally conductive member; and a second adhesive layer formed between the thermally conductive member and the chassis base to adhere the plasma display panel and the thermally conductive member. Each adhesive strength of the first and second adhesive layers may be greater than a restoring force created by a distortion of the plasma display panel.

In yet another embodiment, an improved plasma display device may include a plasma display panel; a chassis base supporting the plasma display panel; a thermally conductive member disposed between the plasma display panel and the chassis base; and an adhesive layer formed between the plasma display panel and the thermally conductive member to adhere the plasma display panel and the thermally conductive member. An adhesive strength of the adhesive layer may be greater than a restoring force created by a distortion of the plasma display panel.

BRIEF DESCRIPTION OF THE DRAWINGS

These and/or other aspects and advantages of the invention may become apparent and more readily appreciated from the following description of various embodiments, taken in conjunction with the accompanying drawings.

DETAILED DESCRIPTION OF THE PREFERRED EMBODIMENTS

Figure 1:
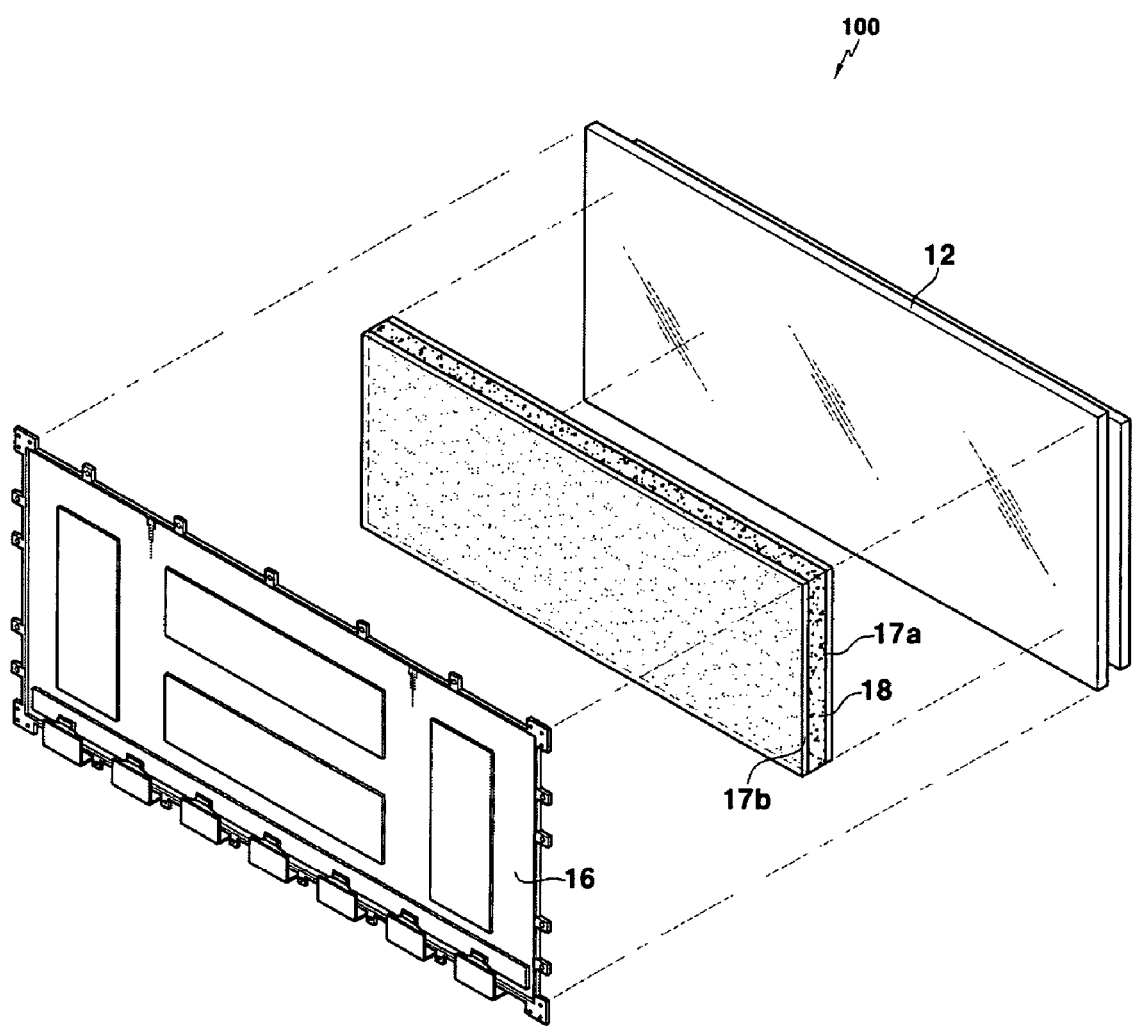
FIG. 1 is a schematic exploded perspective view of an improved plasma display device of a first embodiment of the present invention.
Figure 2:
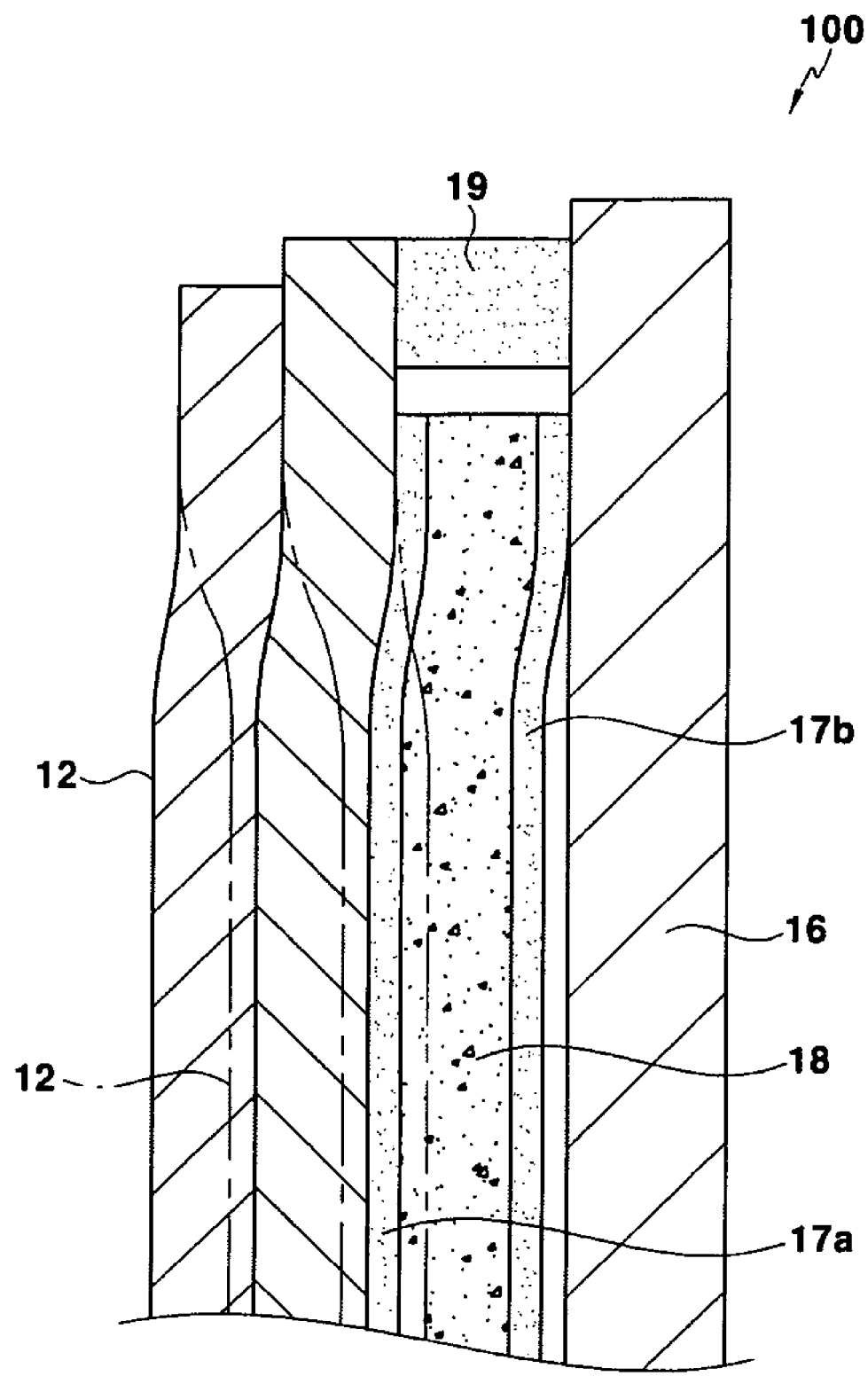
FIG. 2 is a schematic cross-sectional view of the plasma display device of FIG. 1 in an assembled state.

FIG. 1 is a schematic exploded perspective view of an improved plasma display device of a first embodiment of the present invention, and FIG. 2 is a schematic cross-sectional view of the plasma display device of FIG. 1 in an assembled state.

With reference to FIG. 1 and FIG. 2, a plasma display device 100 may include a plasma display panel (PDP) 12 and a chassis base 16.

A front cover (not shown) may be positioned over the front of the POP 12, and a back cover (not shown) may be positioned over the back of the chassis base 16. When assembled, the front and back covers may form an exterior of the plasma display device 100.

The PDP 12 has a front substrate and a rear substrate with a plurality of discharge cells formed between them. Each substrate may have a substantially square or rectangular shape.

During the manufacturing process, the PDP 12 may experience a firing stage, and this firing stage may cause the PDP 12 to distort to have a convex surface on one side and a concave surface on the other.

Referring briefly to FIG. 2, the dashed line therein illustrates that if a predetermined temporary pressure is applied to the thermally distorted PDP 12, the temporary pressure distorts the concave surface of the PDP 12 toward the thermally conductive member 18. If the temporary pressure is eliminated, however, the PDP 12 reverts to substantially its original configuration.

Referring again to FIG. 1, the chassis base 16 should have sufficient structural strength to support the PDP 12 and a driving circuit board (not shown). Additionally, the chassis base may be configured to release heat generated from the PDP 12 to the outside of the plasma display device. Thus, the chassis base 16 may be manufactured by pressing or die casting a metal having sufficient structural strength and thermal conductivity. Examples of suitable metals include, but are not limited to, aluminum, copper, or steel.

A thermally conductive member 18 may be disposed between the PDP 12 and the chassis base 16. To release and disperse heat, the thermally conductive member 18 should closely couple to the PDP 12 and the chassis base 16. The thermally conductive member 18 may be formed with acryl-based, graphite-based, metal-based, or carbon nanotube-based heat dissipation material having a high thermal conductivity.

The thermally conductive member 18 may be configured to absorb more heat from the PDP 12 than is transferred from the thermally conductive member 18 to the chassis base 16.

As shown in FIG. 2, an adhesive member 19 may be further provided adjacent a portion of a perimeter of the thermally conductive member 18 between the PDP 12 and the chassis base 16 to adhere the PDP 12 to the chassis base 16. The adhesive member 19 may be composed of a general double coated tape, which may be made using material having a predetermined elasticity as base material. Adhesive member 19 may be disposed to adjoin one or more sides of the thermally conductive member 18, and thereby, adhere a portion of the PDP 12 with a portion of the chassis base 16 while also securing of the thermally conductive member 18 in a desired position. The adhesive member 19 may be elastically distorted by temporary pressure applied to the PDP 12, and when the temporary pressure is eliminated, the adhesive member 19 may revert to substantially its original thickness.

In the present invention, the thermally conductive member 18 may be adhered to both the PDP 12 and the chassis-base 16 by thermally conductive adhesive applied to both sides of the conductive member 18. For example, the plasma display device 100 may include a first adhesive layer 17a formed between the PDP 12 and the thermally conductive member 18, and a second adhesive layer 17b formed between the thermally conductive member 18 and the chassis base 16. The first adhesive layer 17a may be formed by coating adhesive on one surface of the thermally conductive member 18 facing the PDP 12. The second adhesive layer 17b may be formed by coating adhesive on the other surface of the thermally conductive member 18 facing the chassis base 16. In the present embodiment, it may be preferable that the first adhesive layer 17a have a greater adhesive strength than the second adhesive layer 17b. The first and second adhesive layers 17a and 17b may each comprise a material selected from the group consisting of polyethylene terephthalate, silicon, acrylic ester polymer, styrene type resin, and a combination thereof.

Illustratively, the first adhesive layer 17a may have an adhesive strength of about 2,000 g per 25 mm of an adhesion surface of the POP 12. The second adhesive layer 17b may have an adhesive strength of about 1,000 g per 25 mm of an adhesion surface of the chassis base 16. Thus, the adhesion strength of the second adhesive layer 17b may be less than the adhesive strength of the first adhesive layer 17a. Additionally, the adhesive strength of the second adhesive layer 17b may be less than a restoring force that restores the PDP 12 to substantially its original shape after a compressive pressure applied to the PDP 12 is released.

Because of the different adhesive strengths of each of the first and the second adhesive layers 17a and 17b, the PDP 12 may be biased toward the thermally conductive member 18 and adhered to substantially an entire surface of the thermally conductive member 18 via the intermediate first adhesive layer 17a. The secondary adhesive layer 17b may be partially fixed to the chassis base 16 because the secondary adhesive layer 17b has less adhesive strength than the restoring force of the PDP 12, and thus may partially separate from the chassis base 16. In other embodiments, a layer of adhesive may be formed on only the surface of the thermally conductive material 18 that faces the PDP 12.

The following paragraphs describe an exemplary method of assembling a plasma display device 100 having first and the second adhesive layers of similar or varying adhesive strengths. Although the adhesive member is described with reference to several embodiments of the invention, use of the adhesive member may be optional.

The steps of assembly described below may be performed in any suitable order, and the invention is not limited only to the steps listed below. If practice of the invention warrants, additional steps may be employed, or one or more steps may be omitted.

In one embodiment, an adhesive layer 17b may be adhered to one surface of a thermally conductive member 18 (or to a surface of the chassis base 16). The thermally conductive member 18 may then be adhered to the chassis base 16 by positioning the thermally conductive member 18 proximate a surface of the chassis base 16 and pressing the thermally conductive member 18 toward the chassis base 16 until the adhesive layer 17b grips and adheres both components together. Next, an adhesive layer 17a may be adhered to an opposite surface of the thermally conductive member 18 (or to a surface of the PDP 12). Then, an adhesive member 19 may be adhered along one or more edges of the chassis base 16, and/or may adjoin all or part of the perimeter of the thermally conductive material 18.

In this embodiment, the adhesive layer 17a has a greater adhesive strength than the adhesive layer 17b. Thus, although the adhesive layer 17b may partially separate from the chassis base 16, the adhesive layer 17b will remain coupled with the PDP 12.

As shown in FIG. 2, an end of a (heat distorted) PDP 12 may be aligned with an outer exterior edge of the adhesive member 19. Additionally, a concave surface of the PDP 12 may be positioned proximate the thermally conductive member 18. A predetermined pressure may then be applied to the convex side of the PDP 12 to flatten the PDP against the thermally conductive member 18 with the adhesive layer 17a therebetween. As shown by the dotted line in FIG. 2, the applied pressure biases the PDP 12 into close (and substantially universal) contact with the first adhesive layer 17A, which, in turn, closely (and substantially universally) contacts the thermally conductive member 18.

Thereafter, the pressure may be eliminated. Removal of the applied pressure permits the PDP 12 to reverts to substantially its original shape because, in this embodiment, the PDP's restoring force is greater than the adhesive strength of the second adhesive layer 17b. Accordingly, the thermally conductive layer 18 may partially separate from the chassis base 16, as shown in FIG. 2, because the adhesive strength of the second adhesive layer 17b is less than the restoring force of the PDP 12. In the meantime, the first adhesive layer 17a does not separate from the thermally conductive layer 18 or the PDP 12. Instead, the adhesive layer 17a maintains an adhered state since its adhesive strength may be greater than the restoring force provided by the PDP 12.

Thus, the thermally conductive member 18 remains adhered to substantially the entire surface of the PDP 12 even though the PDP reverts to substantially its original position.

In the meantime, since the thermally conductive member 18 has characteristics such that the amount of heat released toward the plane direction of the PDP 12 is greater than the amount of heat released toward the thickness direction of the chassis base 16, the overall efficiency of heat transfer is not substantially affected even though the thermally conductive member 18 is only partially adhered to the chassis base 16.

Figure 3:
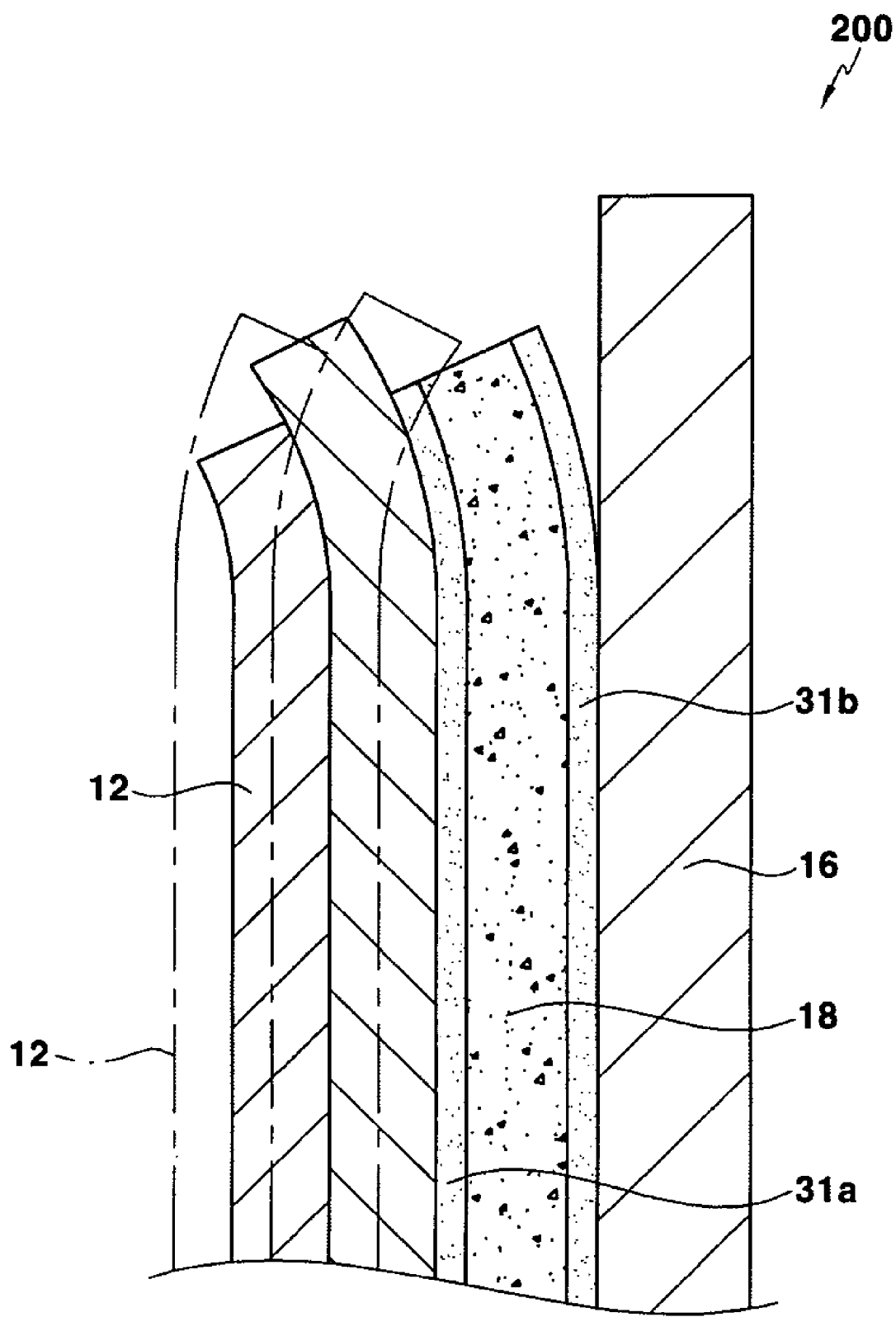
FIG. 3 is a schematic cross-sectional view of an improved plasma display device of a second embodiment of the present invention.

FIG. 3 is a schematic cross-sectional view of a plasma display device according to a second embodiment of the present invention. In the following description, like reference symbols may be used for the same or similar components and the detailed explanation of such components may be omitted.

Referring to FIG. 3, a plasma display device 200 may include a first adhesive layer 31a formed between the PDP 12 and the thermally conductive member 18, and a second adhesive layer 31b formed between the thermally conductive member 18 and the chassis base 16. In this embodiment, each adhesive strength of the first and second adhesive layers 31a and 31b may be greater than the restoring force of the PDP 12.

The first adhesive layer 31a and the second adhesive layer 31b may each be comprised of general adhesive that allows the adhesive strengths of the PDP 12 and the chassis base 16 to the thermally conductive member 18 to be substantially equal.

Accordingly, in the plasma display device 200 of FIG. 3, the PDP 12 may be adhered to substantially the entire surface of the thermally conductive layer 18 by the first adhesive layer 31a in a biased state that distorts the PDP 12 toward the thermally conductive member 18. The other surface of the thermally conductive member 18 may be adhered to substantially the entire surface of the chassis base 16.

The following paragraphs describe an exemplary method of assembling the plasma display device 200. The steps described may be performed in any suitable order, and the invention is not limited either to the steps or order of steps listed below.

Adhesive layers 31a and 31b of approximately equal adhesive strength may be adhered to opposite surfaces of the thermally conductive material 18 (or to a surface of the PDP 12 and to a surface of the chassis base 16). The PDP 12 and the chassis base 16 are then positioned proximate opposite surfaces of the thermally conductive member 18, and pressed inwards until the adhesive layers 31a and 31b adhere the three components together.

As shown by the dashed line in FIG. 3, the PDP 12 may initially be distorted toward the outside direction of the thermally conductive member 18, but is maintained in a substantially flattened state by the adhesion strengths of adhesion layers 31a and 31b. Moreover, the thermally conductive member 18 remains adhered to substantially the entire surface of the chassis base 16 due to the adhesive strength of the second adhesive layer 31b. Additionally, the PDP 12 is distorted toward the thermally conductive member 18 to closely contact the thermally conductive member 18, and adhered to substantially the entire surface of the thermally conductive member 18 by the first adhesive layer 31a.

Thus, the individual and/or combined adhesive strengths of the first and second adhesive layers 31a and 31b may prevent the PDP 12 from reverting to its original position. As a result, the PDP 12 remains substantially adhered to a surface of the thermally conductive member 18, and the chassis base 16 remains substantially adhered to an opposite surface of the thermally conductive member 18.

The plasma display device according to the present invention may improve the adhesive strength of the adhesive layers for fixing the thermally conductive member to the PDP and the chassis base so that a distorted PDP uniformly contacts the thermally conductive member. Accordingly, noise and vibration generated during the driving process may be efficiently reduced, and the heat transfer efficiency of the PDP to the thermally conductive member may be enhanced.

Although several embodiments of the present invention have been shown and described, a skilled artisan will appreciate that changes may be made to the embodiments described herein without departing from the principles and spirit of the invention, the scope of which is defined in the claims that follow.

What is claimed is:

1. A plasma display device, comprising:
    a plasma display panel;
    a chassis base supporting the plasma display panel;
    a thermally conductive member disposed between the plasma display panel and the chassis base;
    a first adhesive layer formed between the plasma display panel and the thermally conductive member to adhere the plasma display panel and the thermally conductive member, and
    a second adhesive layer formed between the thermally conductive member and the chassis base to adhere the thermally conductive member and the chassis base,
    wherein an adhesive strength of the first adhesive layer is greater than an adhesive strength of the second adhesive layer.

2. The plasma display device of claim 1, further including an adhesive member disposed adjacent a portion of a perimeter of the thermally conductive member between the plasma display panel and the chassis base to further adhere the plasma display panel with the chassis base.

3. The plasma display device of claim 1, wherein the first adhesive layer and the second adhesive layer are made of a material selected from the group consisting of polyethylene terephthalate, silicon, acrylic ester polymer, styrene type resin and a combination thereof.

4. The plasma display device of claim 1, wherein after being adhered to the first adhesive layer and to the thermally conductive member, the plasma display panel is distorted outwardly away from a surface of the thermally conductive member.

5. The plasma display device of claim 4, wherein the adhesive strength of the second adhesive layer is less than a restoring force of the plasma display panel.

6. The plasma display device of claim 5, wherein the plasma display panel is adhered to substantially an entire surface of the thermally conductive member by the first adhesive layer, and wherein an opposite surface of the thermally conductive member is partially fixed to the chassis base by the second adhesive layer.

7. The plasma display device of claim 6, wherein an amount of heat absorbed by the thermally conductive member from the plasma display panel is greater than an amount of heat released by the thermally conductive member to the chassis base.

8. The plasma display device of claim 1, wherein the thermally conductive member is made of a first material, the first adhesive layer is made of a second material, and the second adhesive layer is made of a third material, and the first material is different from the second material and the third material.

* * * * *